United States Patent
Sato et al.

(10) Patent No.: US 10,263,180 B2
(45) Date of Patent: Apr. 16, 2019

(54) MAGNETORESISTANCE EFFECT ELEMENT AND MAGNETIC MEMORY

(71) Applicant: TOHOKU UNIVERSITY, Sendai-shi, Miyagi (JP)

(72) Inventors: Hideo Sato, Sendai (JP); Shinya Ishikawa, Sendai (JP); Shunsuke Fukami, Sendai (JP); Shoji Ikeda, Sendai (JP); Fumihiro Matsukura, Sendai (JP); Hideo Ohno, Sendai (JP); Tetsuo Endoh, Sendai (JP)

(73) Assignee: TOHOKU UNIVERSITY, Sendai-shi, Miyagi (JP)

( * ) Notice: Subject to any disclaimer, the term of this patent is extended or adjusted under 35 U.S.C. 154(b) by 0 days.

(21) Appl. No.: 15/657,148

(22) Filed: Jul. 22, 2017

(65) Prior Publication Data
US 2017/0324030 A1   Nov. 9, 2017

Related U.S. Application Data

(63) Continuation of application No. PCT/CN2016/051758, filed on Jan. 21, 2016.

(30) Foreign Application Priority Data

Jan. 22, 2015   (JP) .................................. 2015-010186

(51) Int. Cl.
*H01L 43/08*   (2006.01)
*H01L 27/105*   (2006.01)
(Continued)

(52) U.S. Cl.
CPC ............ *H01L 43/08* (2013.01); *G11C 11/161* (2013.01); *G11C 11/1673* (2013.01);
(Continued)

(58) Field of Classification Search
None
See application file for complete search history.

(56) References Cited

U.S. PATENT DOCUMENTS

2004/0136233 A1   7/2004   Ohmori
2009/0140358 A1   6/2009   Nakayama et al.
(Continued)

FOREIGN PATENT DOCUMENTS

JP   2004-165451 A   6/2004
JP   2004-259913 A   9/2004
(Continued)

OTHER PUBLICATIONS

Kubota et al.; Dependence of spin-transfer switching current on free layer thickness in Co—Fe—B/MgO/Co—Fe—B magnetic tunnel junctions; Appl. Phys. Lett. 89, 032505(2006):10.1063/1.2222241, p. 11 of spec.
(Continued)

*Primary Examiner* — Michelle Mandala
(74) *Attorney, Agent, or Firm* — Rabin & Berdo, P.C.

(57) ABSTRACT

A magnetoresistance effect element includes a reference layer made of a ferromagnetic material, a recording layer made of a ferromagnetic material, and a barrier layer disposed between the reference layer and the recording layer. The reference layer and the recording layer have an in-plane magnetization direction parallel to a surface of the layers. The recording layer has a shape that has short axis and long axis perpendicular to the short axis in plan view. A first value obtained by dividing a thickness of the recording layer by a length of the short axis of the recording layer is greater than 0.3 and smaller than 1.

15 Claims, 14 Drawing Sheets

(51) Int. Cl.
*H01L 29/82* (2006.01)
*G11C 11/16* (2006.01)
*H01L 27/22* (2006.01)
*H01L 43/02* (2006.01)

(52) U.S. Cl.
CPC ........ *G11C 11/1675* (2013.01); *H01L 27/105* (2013.01); *H01L 27/222* (2013.01); *H01L 27/228* (2013.01); *H01L 29/82* (2013.01); *H01L 43/02* (2013.01)

(56) References Cited

U.S. PATENT DOCUMENTS

| | | |
|---|---|---|
| 2009/0302403 A1 | 12/2009 | Nguyen |
| 2013/0028011 A1* | 1/2013 | Kitagawa ............... G11C 11/161 365/158 |

FOREIGN PATENT DOCUMENTS

| | | |
|---|---|---|
| JP | 2006-93432 A | 4/2006 |
| JP | 2006-108565 A | 4/2006 |
| JP | 2007-294737 A | 11/2007 |

OTHER PUBLICATIONS

Yakata et al.; Influence of perpendicular magnetic anisotropy on spin-transfer switching current in CoFeB/MgO/CoFeB magnetic tunnel junctions; Appl. Phys. 105, 07D131(2009); 10.1063/1.3057974, p. 12 of spec.

Amiri et al.; Switching current reduction using perpendicular anisotropy in CoFeB—MgO magnetic tunnel junctions; Appl. Phys. Lett. 98, 112507(2011); 10.1063/1.3567780, p. 12 of spec.

Hayakawa et al.; Current-Induced Magnetization Switching in MgO Barrier Magnetic Tunnel Junctions With CoFeB-Based Synthetic Ferrimagnetic Free Layers; IEEE Transactions on Magnetics, vol. 44, No. 7, Jul. 2008, p. 12 of spec.

* cited by examiner

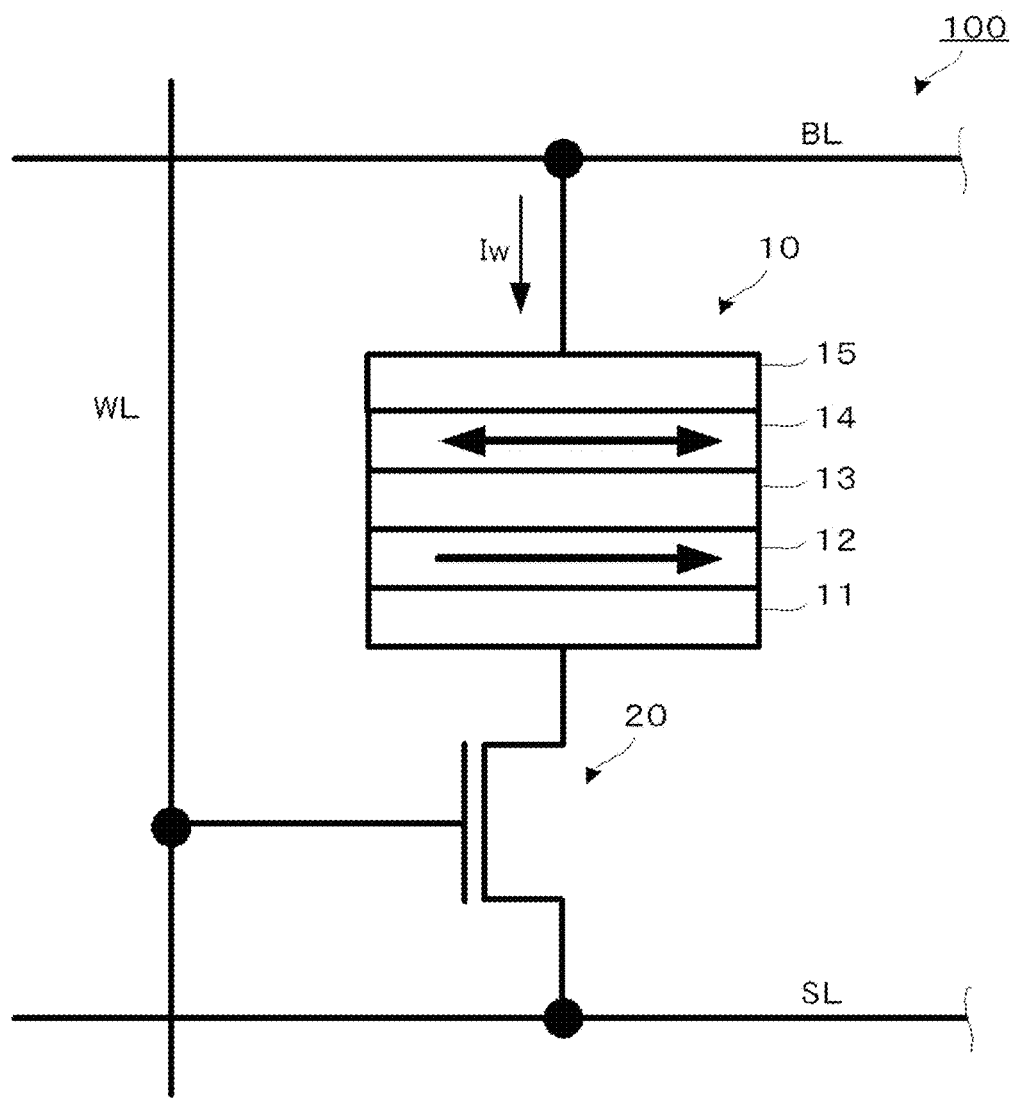

THERMAL STABILITY INDEX $\Delta$

DATA STORAGE PERIOD (s) $\tau = \tau_0 \exp(\Delta)$

MAGNETORESISTANCE EFFECT ELEMENT AND MAGNETIC MEMORY

BACKGROUND OF THE INVENTION

Technical Field

The present invention relates to a magnetoresistance effect element and magnetic memory.

Background Arts

A magnetic memory configured to utilize the magnetization reversal by spin transfer writing is drawing attention as a non-volatile memory element capable of magnetization reversal with a small electric current.

A magnetic memory utilizing the magnetization reversal by spin transfer is made of a magnetic tunnel junction element (MTJ element), and includes a reference layer (stationary layer) with a fixed magnetization direction, a tunnel insulating film, and a recording layer (free layer) that changes the magnetization direction, the reference layer and the recording layer being stacked with the tunnel insulating film interposed therebetween (see Japanese Patent Application Laid-open Publication No. 2004-259913 and Japanese Patent Application Laid-open Publication No. 2006-93432 (Patent Document 2), for example).

In the early stage of the research on the magnetoresistance effect element, many of the elements are of the in-plane magnetization type in which the magnetization direction of the reference layer and recording layer is parallel to the film plane. However, the magnetoresistance effect element of the in-plane magnetization type has a problem of small performance index (reversal efficiency).

The performance index is an index represented by a ratio of thermal stability index to write current (thermal stability index/write current). The thermal stability index indicates the resistance of the recorded data against heat, and in order for a non-volatile memory to store data for a long period of time, it is desirable to have a large thermal stability index. Japanese Patent Application Laid-open Publication No. 2007-294737 (Patent Document 3) discloses the technique to realize a magnetoresistance effect element with a high thermal stability, for example. On the other hand, it is preferable that the write current be small from the perspective of energy saving. Therefore, the greater the performance index (thermal stability index/write current) is, the more desirable.

SUMMARY OF THE INVENTION

The magnetoresistance effect element of the in-plane magnetization type has a problem of small performance index. In other words, a magnetoresistance effect element of the in-plane magnetization type is not capable of saving a recorded data for a long period of time, and overwriting of the recorded data requires a large write current.

In recent years, in order to improve the performance index, a magnetoresistance effect element of the perpendicular magnetization type in which the magnetization direction is perpendicular to the plane of the ferromagnetic film is studied. However, options for the ferromagnetic material exhibiting the perpendicular magnetic anisotropy are limited, and therefore, the magnetoresistance effect element of the perpendicular magnetization type has a problem of limited choices of material. Thus, there is a strong demand for a magnetoresistance effect element of the in-plane magnetization type that can achieve a high performance index.

The present invention was made in view of this situation, and an object thereof is to provide a magnetoresistance effect element of the in-plane magnetization type with a high performance index, and a magnetic memory.

In order to achieve the above-described problems, a magnetoresistance effect element of the invention includes: a reference layer made of a ferromagnetic material, the reference layer having an in-plane magnetization direction parallel to a surface of the reference layer; a recording layer made of a ferromagnetic material, the recording layer having the in-plane magnetization direction, the recording layer having a shape that has short axis and long axis perpendicular to the short axis in plan view, a first value obtained by dividing a thickness of the recording layer by a length of the short axis of the recording layer being greater than 0.3 and being smaller than 1; and a barrier layer disposed between the reference layer and the recording layer.

The magnetoresistance effect element may have a performance index equal to or greater than 1.5 $\mu A^{-1}$. The performance index is obtained by dividing a thermal stability index of the magnetoresistance effect element by a write current of the magnetoresistance effect element. The thermal stability index of the magnetoresistance effect element may be equal to or greater than 60.

Further, the length of the short axis of the recording layer may be equal to or less than 30 nm. The length of the short axis of the recording layer may be equal to or less than 14 nm.

Furthermore, a second value obtained by dividing a length of the long axis of the recording layer by the length of the short axis of the recording layer may be greater than 1.5.

Moreover, a second value obtained by dividing a length of the long axis of the recording layer by the length of the short axis of the recording layer may be less than 4.

A magnetic memory of the present invention is a magnetic memory having the above-described magnetoresistance effect element as a memory cell.

According to the present invention, "film thickness of the recording layer/length of the short axis of the recording layer" is greater than 0.3. This size ratio makes possible a high performance index, and as a result, it is possible to obtain a magnetoresistance effect element with a high performance index, and a magnetic memory using the magnetoresistance effect element as a memory cell.

BRIEF DESCRIPTION OF THE DRAWINGS

FIG. 3 is a diagram showing the configuration of a magnetic memory circuit including a magnetoresistance effect element of an embodiment of the present invention.

FIG. 7A is a diagram showing a relationship between the film thickness of the recording layer and the thermal stability index, FIG. 7B is a diagram showing a relationship between the film thickness of the recording layer and the write current, and FIG. 7C is a diagram showing a relationship between the film thickness of the recording layer and the performance index.

DETAILED DESCRIPTION OF EMBODIMENTS

Below, a magnetoresistance effect element of an embodiment of the present invention and a magnetic memory using such a magnetoresistance effect element will be explained.

Figure 1:
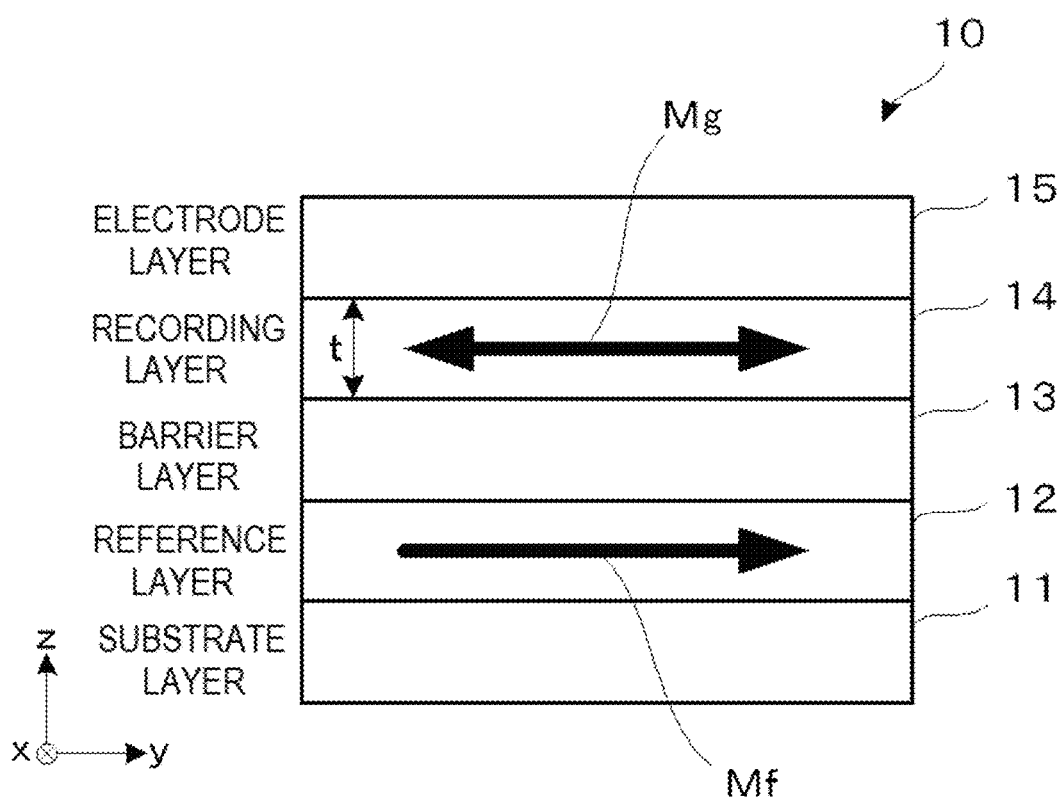
FIG. 1 is a diagram showing a multilayer structure of a magnetoresistance effect element of an embodiment of the present invention.

As shown in FIG. 1, a magnetoresistance effect element 10 of this embodiment includes a substrate layer (buffer layer or electrode layer) 11, a reference layer (stationary layer) 12, a barrier layer 13, a recording layer (free layer) 14, and an electrode layer 15 stacked in this order.

The substrate layer 11 is made of a metal such as Ta.

The reference layer 12 is made of a ferromagnetic material having the easy axis of magnetization in the direction parallel to the film plane (in-plane magnetization direction), and the direction of magnetization Mf is fixed to one direction.

A material including a 3d transition metal such as Fe, Co, and Ni can be used for the material for the reference layer 12, for example. Specific examples thereof include a 3d transition metal such as Fe, Co, Ni, and an alloy including a 3d transition metal such as Fe—Co, Fe—Ni, Co—Ni, Fe—Co—Ni, Co—Fe—B, Fe—B, and Co—B. It is also possible to adjust the material by adding B, C, N, O, Al, Si, P, Ga, Ge, or the like such that a desired electrical property or structure can be achieved.

The reference layer 12 may have a multi-layer structure that exhibits the multi-layer ferri coupling. In this case, it is preferable to use Ru as a bonding layer.

The reference layer 12 may also include an antiferromagnetic layer. In this case, it is possible to fix the magnetization more stably. Examples of the antiferromagnetic material that can be used include an Ir—Mn alloy, Pt—Mn alloy, and the like.

The barrier layer 13 is made of an insulator and forms a tunnel barrier. Examples of the material for the barrier layer 13 include an insulating layer including oxygen such as MgO and $Al_2O_3$, or AlN.

The recording layer 14 is made of a ferromagnetic material having the easy axis of magnetization in the direction parallel to the film plane (in-plane magnetization direction), and the direction of magnetization Mg is changed by the spin transfer writing. The in-plane magnetization direction of the reference layer 12 and the in-plane magnetization direction of the recording layer 14 are both directions parallel to the film plane, and each of the in-plane magnetization direction of the reference layer 12 and the in-plane magnetization direction of the recording layer 14 may be a different direction other than a direction perpendicular to each other, or may be a direction parallel to each other.

A material including a 3d transition metal such as Fe, Co, and Ni can be used for the material for the recording layer 14, for example. Specific examples thereof include a 3d transition metal such as Fe, Co, Ni, and an alloy including a 3d transition metal such as Fe—Co, Fe—Ni, Co—Ni, Fe—Co—Ni, Co—Fe—B, Fe—B, and Co—B. It is also possible to adjust the material by adding B, C, N, O, Al, Si, P, Ga, Ge, or the like such that a desired electrical property or structure can be achieved.

The electrode layer 15 is made of a conductor such as a metal. The electrode layer 15 is made of Ta, for example.

Figure 2:
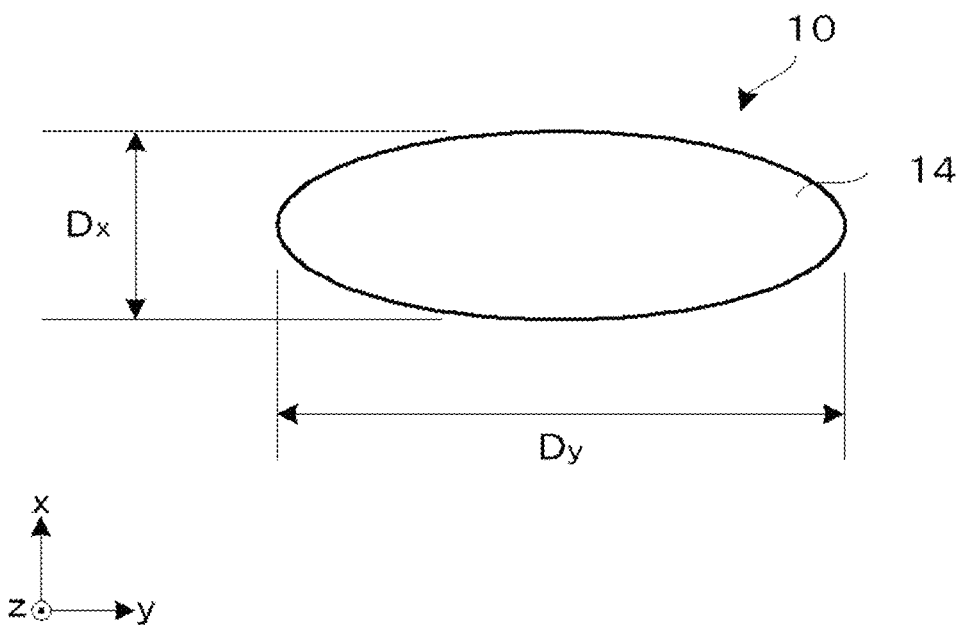
FIG. 2 is a diagram showing a planar structure of a magnetoresistance effect element of an embodiment of the present invention.

In this embodiment, the recording layer 14 has an oval shape in a plan view as shown in FIG. 2. The long axis of the oval is Y, the short axis is X, and the thickness direction is Z. The length of the recording layer 14 in the Y axis direction, or in other words, the length of the long axis (long axis length) is Dy, the length in the X axis direction, or in other words, the length of the short axis (short axis length) is Dx, and the film thickness (thickness) is t. Generally, the barrier layer 13 and the reference layer 12 have substantially the same configuration except for the deformation due to patterning. However, those layer do not have to have the same shape or the same configuration.

In this embodiment, in order to achieve a high performance index of 1.5 $\mu A^{-1}$ or higher while taking into consideration other conditions that have the trade-off relationship with the performance index, the recording layer 14 is configured to have a size that meets the following conditions: 1≥thickness t/short axis length Dx>0.3; and 4>long axis length Dy/short axis length Dx>1.5. This will be explained in detail later.

In one embodiment of the magnetoresistance effect element 10, the reference layer 12 has a multi-layer structure including a PtMn layer (15 nm), a CoFe layer (2.5 nm), a Ru layer (0.9 nm), and a CoFeB layer (1.5 nm) stacked in this order from the side of the electrode 11.

The barrier layer 13 is made of an MgO layer (1 to 2 nm).

The recording layer 14 is made of a CoFeB layer, and is configured to have a size that meets the following conditions: 1≥thickness t/short axis length Dx>0.3; and 4>long axis length Dy/short axis length Dx>1.5.

For example, the thickness t is 10 nm, the short axis length Dx is 10 nm (4 to 16 nm), and the long axis length Dy is 28 nm (15 to 35 nm).

The substrate layer 11 and the electrode layer 15 are respectively made of Ta (5 nm).

Next, a magnetic memory circuit 100 using the magnetoresistance effect element 10 having the configuration described above as a memory cell will be explained with reference to FIG. 3.

The magnetic memory circuit 100 has a plurality of 1-bit memory cells arranged in a matrix, each of the memory cells being constituted of the magnetoresistance effect element 10 and a select transistor 20 as shown in FIG. 3.

In the select transistor 20, the source electrode is electrically connected to a source line SL, the drain electrode is electrically connected to the substrate layer 11 of the magnetoresistance effect element 10, and the gate electrode is electrically connected to a word line WL. The electrode layer 15 of the magnetoresistance effect element 10 is connected to a bit line BL.

Figure 4A:
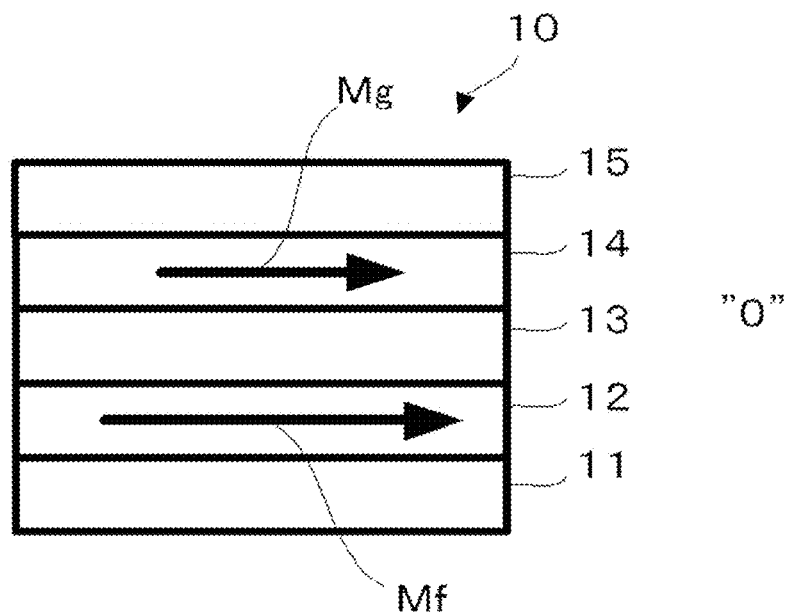
FIGS. 4A and 4B are diagrams for explaining the parallel state (low resistance state) and the anti-parallel state (high resistance state) of a magnetoresistance effect element.
Figure 4B:
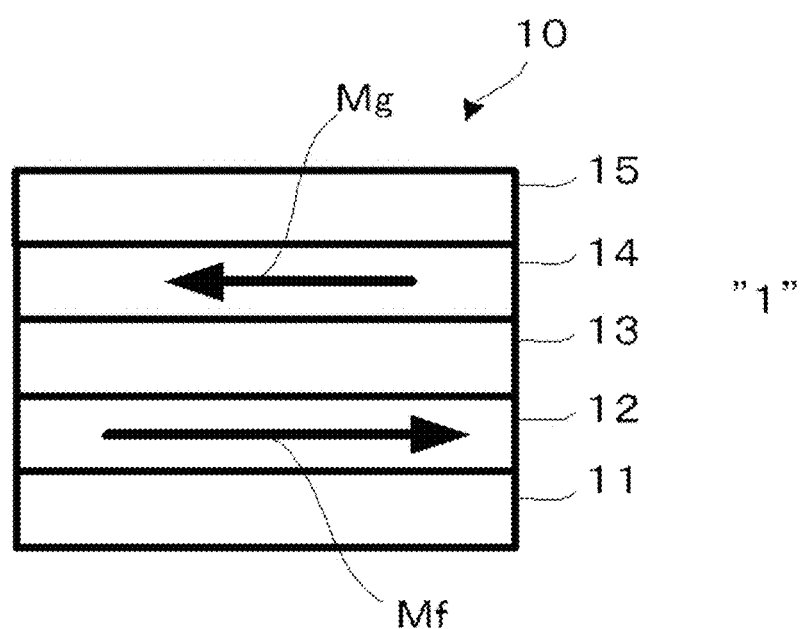

As shown in FIG. 4A, when the direction of magnetization Mf of the reference layer 12 and the direction of magnetization Mg of the recording layer 14 are parallel to each other and the same as each other (P state), the resistance between the substrate layer 11 and the electrode layer 15 is low. On the other hand, as shown in FIG. 4B, when the respective directions are anti-parallel (parallel, but opposite to each other: AP state), the resistance is high. This high level and low level of the resistance value correspond to "0" and "1" of the bit information, respectively. In this embodiment, "0" is assigned to the low resistance, and "1" is assigned to the high resistance.

In order to write information in the magnetoresistance effect element 10, the voltage of the word line WL connected to the magnetoresistance effect element 10 subjected to the write-in is controlled, thereby turning on the corresponding select transistor 20. Next, by adjusting the voltage applied between the bit line BL and the source line SL, the direction and size of a write current $I_w$ flowing through the magnetoresistance effect element 10 are controlled, and the desired data is written by the spin transfer magnetization reversal.

When the write current $I_w$ flows from the recording layer 14 to the reference layer 12, the magnetization Mg of the recording layer 14 is parallel to the magnetization Mf of the reference layer 12, and when the write current $I_w$ flows from the reference layer 12 to the recording layer 14, the magnetization of the recording layer 14 is anti-parallel to the magnetization of the reference layer 12.

On the other hand, in order to read out data, a select voltage is applied to the word line WL, thereby turning on the select transistor 20, and a read-out voltage is applied between the bit line BL and the source line SL. The value of the read-out current corresponding to the applied read-out voltage determines the level of the resistance value of the magnetoresistance effect element 10, i.e., high or low, and as a result, the recorded data is read out.

Next, how the performance index of the magnetoresistance effect element 10 of this embodiment having the above-described configuration is better than a conventional configuration will be explained.

The write current $I_w$ and the thermal stability index Δ of the magnetoresistance effect element 10 having the configuration shown in FIGS. 1 and 2 are represented by Formula (1) and Formula (2).

$$I_w = \alpha \cdot [e/(\hbar^- \cdot g(\theta))](Ms \cdot V)[Ms/2\mu_0)((Nz-Ny)+(Nx-Ny))] \quad (1)$$

$$\Delta = [(Nx-Ny)/2] \cdot [Ms^2 V/(2\mu_0 k_B T)] \quad (2)$$

where Nz={(1−(Nx+Ny)}, and α: damping constant, $\hbar^-$: Dirac constant, e: elementary charge, Ms: saturation magnetization, V: volume, $\mu_0$: magnetic permeability of vacuum, Ny: demagnetizing field coefficient of Y axis direction (long axis direction), Nx: demagnetizing field coefficient of X axis direction, Nz: demagnetizing field coefficient in the film thickness direction, P: spin polarization ratio, θ: relative angle of magnetization between the recording layer and reference layer (0 or π), $k_B$: Boltzmann constant, and T: absolute temperature.

The damping constant α is set to 0.005, which is a standard level, and the spin polarization ratio is set to 0.45, which is a standard level.

In the descriptions below, the write current $I_w$ takes the average value of the case in which θ is 0 and the case in which θ is π.

First, the problem of the conventional configuration of the in-plane magnetization type will be described. In the conventional example such as Kubota et al., Applied Physics Letters Vol. 89,032505 (2006) (Non-patent Document 1), for example, Dx=70 nm, Dy=160 nm, and t=2 nm. In this case, based on the numerical calculation, Nz=0.94, Nx=0.05, and Ny=0.01. If the saturated magnetization is set to 1.38 T, which is reported in Non-patent Document 1, the write current $I_w$ and the thermal stability index Δ are respectively 434 μA and 102, based on Formulas (1) and (2). As a result, the value of the performance index $\Delta/I_w$ is 0.24 μA-1$^{-1}$.

The performance index that is as low as this is not appropriate for making a memory using the magnetic tunnel junction, and therefore, there have been attempts to improve the performance index using the surface magnetic anisotropy of the interface between the ferromagnetic material and the oxide as described in Yakata et al., Journal Applied Physics Vol. 105,07D131 (2009) and Khalili Amiri et al., Applied Physics Letters Vol. 98,112507 (2011). Patent Documents 2 and 3 and Jun Hayakawa et al., IEEE Transactions On Magnetics, 40, 1962 (2009) (Non-patent Document 4) are attempting to improve the performance index by modifying the multi-layer structure. However, the highest performance index achieved in those prior arts is 1.4, which is reported in Non-patent Document 4, and this value is not sufficient for a memory using the magnetic tunnel junction described below.

On the other hand, in the present invention, the inventors focused on the ratio of the film thickness to the short axis length. The physical factor for the small performance index in the conventional configurations is the ratio of the film thickness to the short axis length being small, which causing Nx and Ny to be small and Nz to be large. As apparent from Formula (1) and Formula (2), this reduces the thermal stability index Δ and increases the write current $I_w$, resulting in a lower performance index. The inventor has found that making the ratio of the film thickness to the short axis length greater reduces Nz and increases Nx and Ny, which results in a greater $\Delta/I_w$. Below, the effect of the present invention will be explained based on the specific calculation results.

Figure 6A:
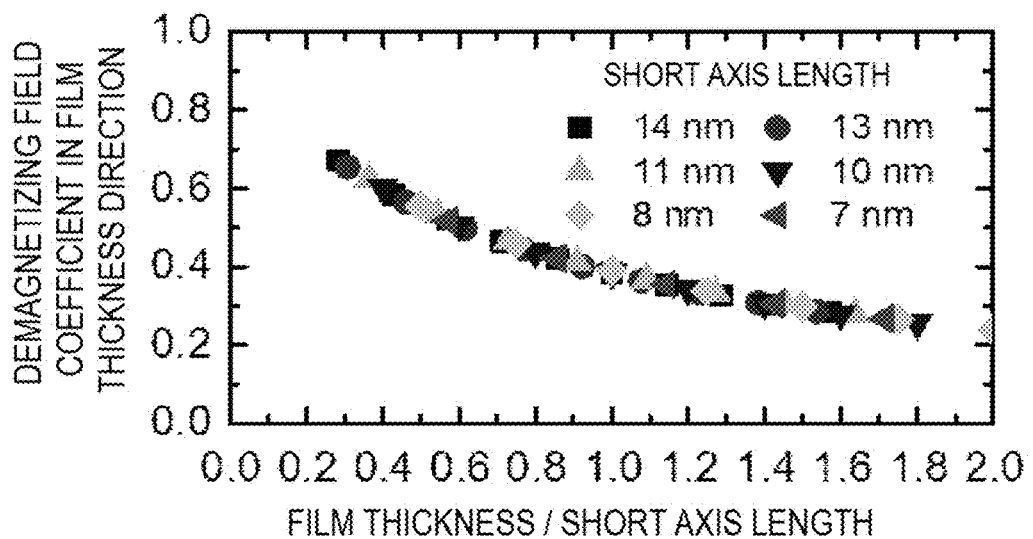
FIGS. 6A-6C are graphs showing a relationship between the demagnetizing factor and the ratio of the film thickness to the short axis length.
Figure 6B:
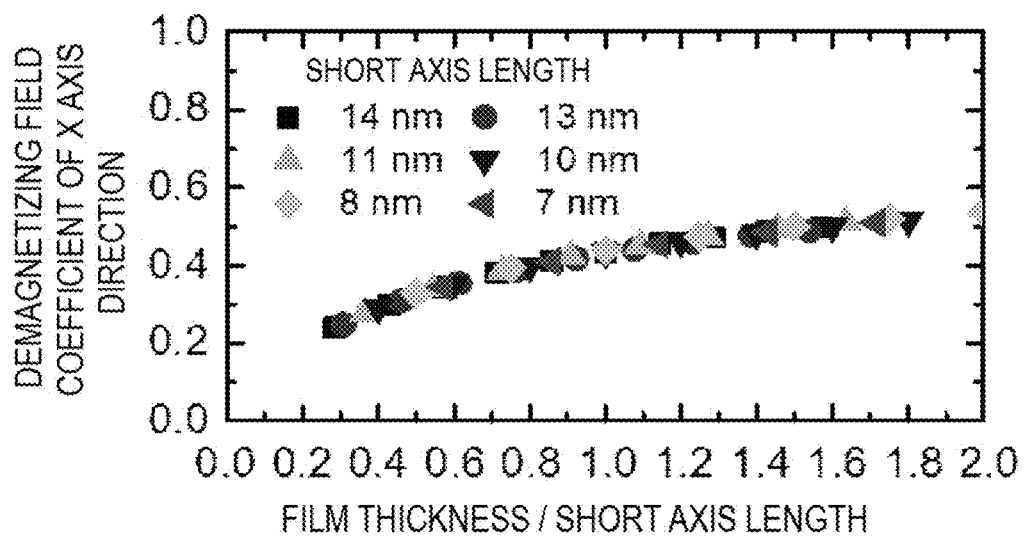
Figure 6C:
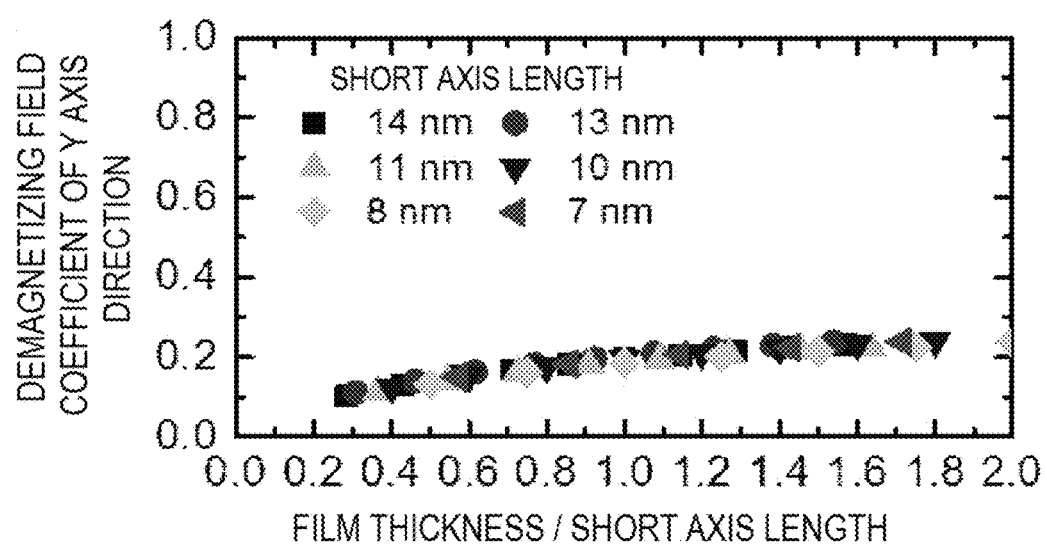

For the six different combinations of the short axis length Dx×long axis length Dy, which are 7×14 nm$^2$, 8×17 nm$^2$, 10×20 nm$^2$, 11×23 nm$^2$, 13×25 nm$^2$, 14×28 nm$^2$, Nx, Ny, and Nz were obtained, and sorted with respect to the ratio of the film thickness to the short axis length as shown in FIGS. 6A to 6C. As the ratio of the film thickness to the short axis length increases, Nx and Ny also increase, and Nz decreases. In the conventional configuration, the greatest ratio of the film thickness to the short axis length is approximately 0.06, which is very small compared with the configuration of this study.

Figure 7A:
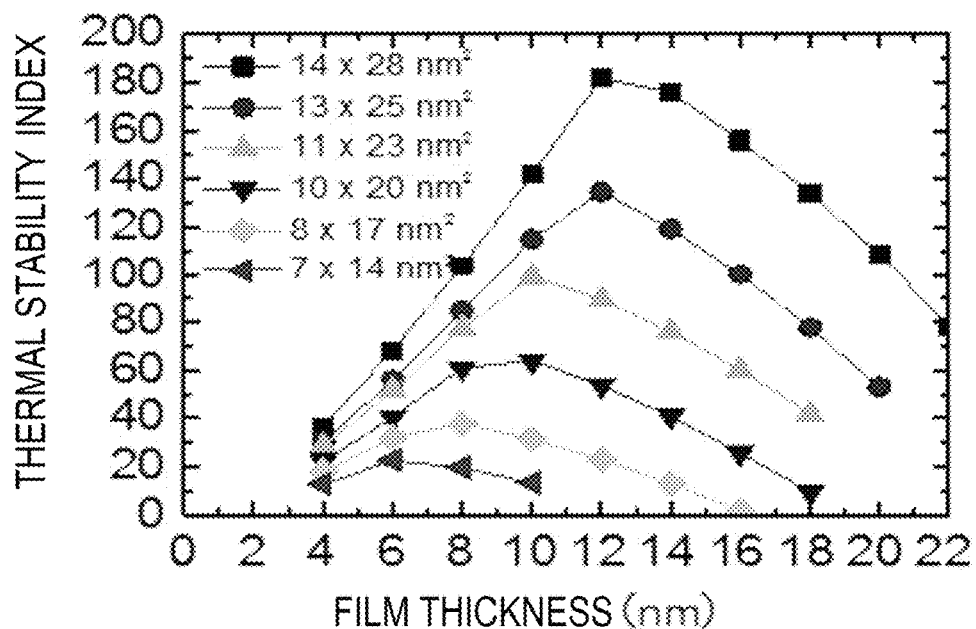
FIGS. 7A to 7C are diagrams showing the characteristics of the magnetoresistance effect element according to an embodiment of the present invention for a recording layer of different sizes.
Figure 7B:
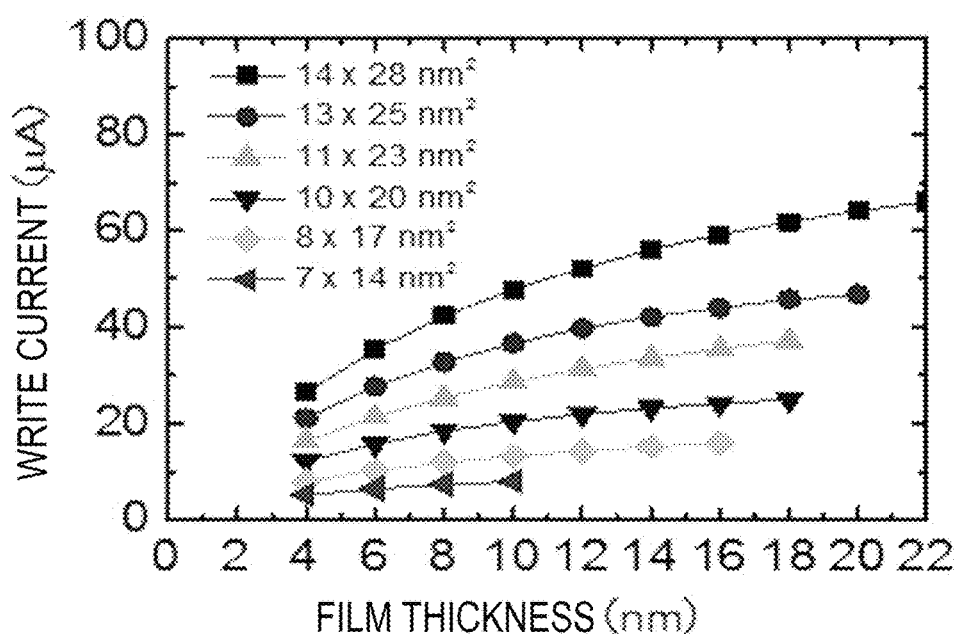
Figure 7C:
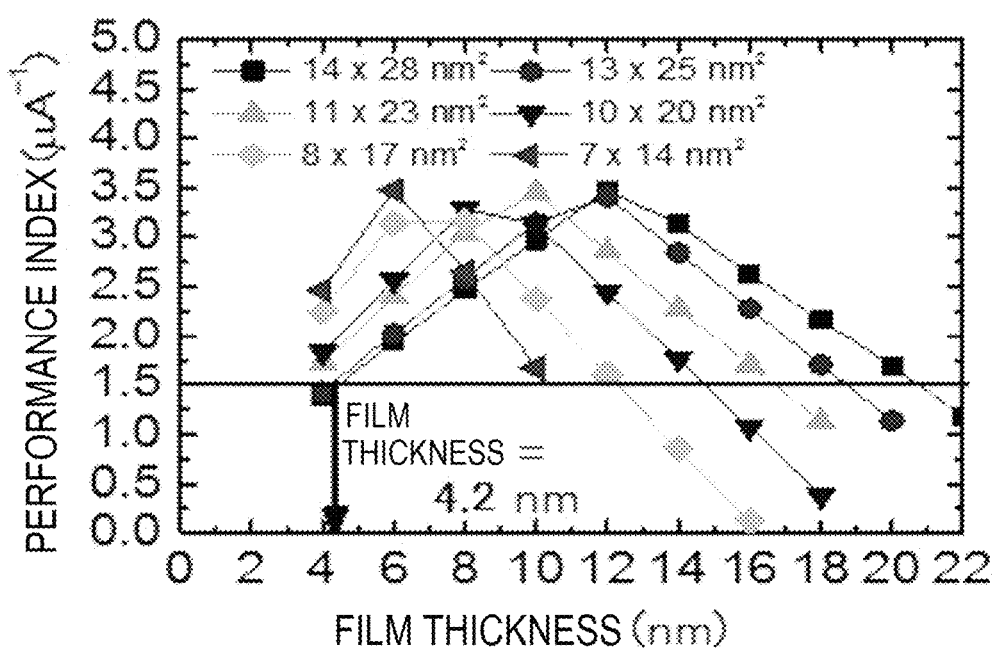
Figure 8A:
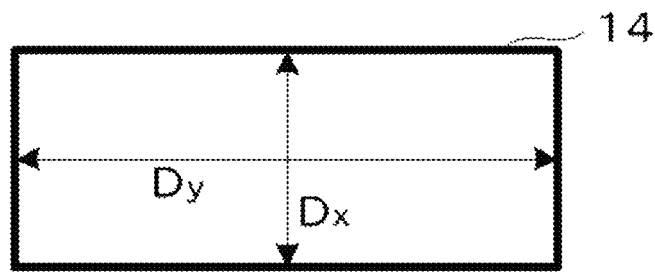
FIGS. 8A to 8D are diagrams showing other examples of the shape of the recording layer of a magnetoresistance effect element of an embodiment in a plan view.
Figure 8B:
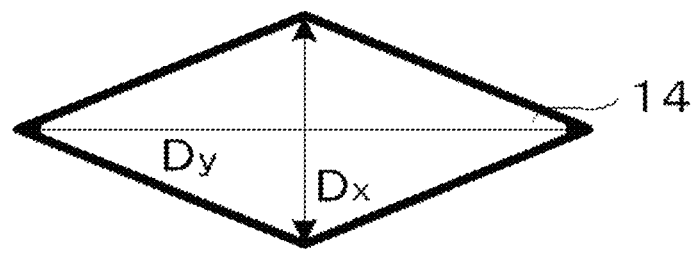
Figure 8C:
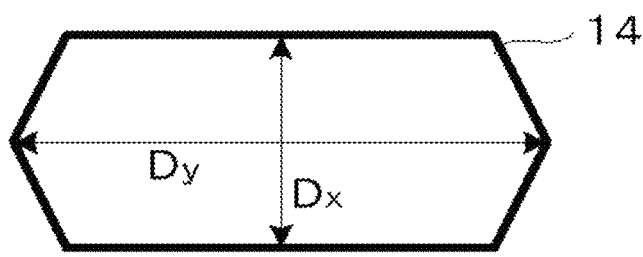
Figure 8D:
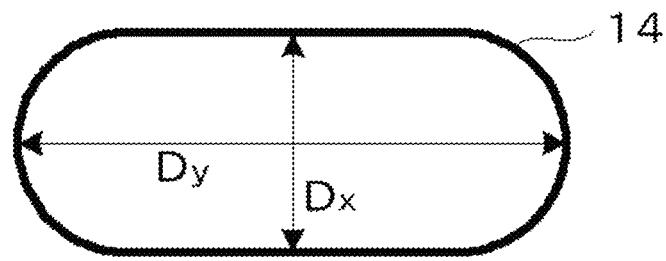

Next, the thermal stability index Δ and the write current $I_w$ are calculated using those Nz, Ny, and Nz values, and Formula (1) and Formula (2). FIGS. 7A and 7B show the resultant values with respect to the film thickness t. The saturated magnetization was set to 1.3 T, which is a typical value of CoFeB. As apparent from FIGS. 7A and 7B, the thermal stability index Δ reaches a peak at a certain film thickness (t), while the write current $I_w$ is a monotonically increasing function to the film thickness. Thus, by designing the recording layer to have a film thickness near the peak of the thermal stability index Δ, it is possible to achieve a high performance index. FIG. 7C shows the calculated value of the performance index $\Delta/I_w$.

In order to use the magnetoresistance effect element 10 as a non-volatile memory, the data storage period needs to be at least 10 years (see the recommended value for STT- MRAM of 2011_ERD3 in ITRS (The International Technology Roadmap for Semiconductors), for example).

Figure 5:
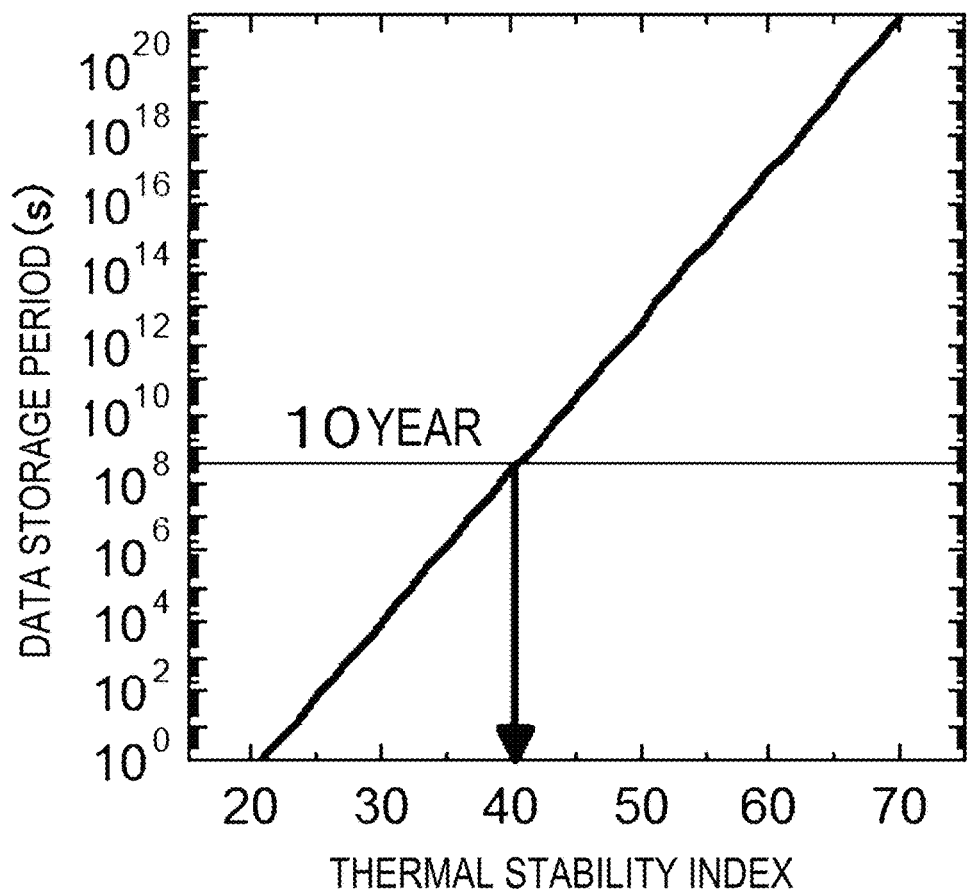
FIG. 5 is a graph showing a relationship between the thermal stability index and the data store time.

As shown in FIG. 5, there is a correlation between the thermal stability index Δ and the data storage period τ, and in order to achieve the 10-year storage period, the thermal stability index Δ needs to be at least 40. Furthermore, when the variations among respective elements (variations in material, variations in manufacturing process, and the like), a difference in usage environment, and the like are taken into consideration, it is preferable that the thermal stability index Δ be at least 60.

Also, there is a correlation between the gate width of the select transistor 20 and the upper limit of the electric current to be supplied, and for example, for the gate width 40 nm, which is the technology generation with little possibility for further improvement of the performance of a semiconductor memory such as SRAM (static random access memory) or DRAM (Dynamic Random Access Memory), the upper limit of the electric current to be supplied is 40 μA. Furthermore, if the select transistor 20 is reduced in size in the future (higher integration), the write current $I_w$ needs to be further reduced.

Thus, if the gate width of the select transistor 20 is 40 nm, the performance index $\Delta/I_w$ needs to be at least $\Delta/I_w=60/40$ $\mu A \approx 1.5$ $\mu A^{-1}$. If the technology is further developed, and the gate width is reduced more, the greater performance index will be necessary.

However, there is no report on the magnetoresistance effect element of the conventional in-plane magnetization type that has achieved such a greater performance index, and the highest so far is approximately 1.4.

In FIG. 7C, when the conditions that make the performance index $\Delta/I_w$ at least 1.5 $\mu A^{-1}$ are compared, the condition of the recording layer 14 being 14×28 nm² is closest to the lower limit, and 4.2/14≈0.3.

The more detailed simulation and studies have confirmed that by making "film thickness t/short axis length Dx of the recording layer 14" greater than 0.3, the performance index becomes at least 1.5 $\mu A^{-1}$, which results in a magnetic memory with a great property.

On the other hand, if the film thickness t is greater than the short axis length Dx, the magnetization reversal due to the thermal energy does not occur on the film plane when the magnetization direction of the recording layer 14 is reversed, and because the magnetization rotates in the Z axis direction (perpendicular direction to the film plane), the thermal stability index is reduced. As a result, even if the film thickness t is made greater, the performance index $\Delta/I_w$ would reduce after the peak. Thus, it is preferable that "t" be smaller than Dx.

According to this point, the condition of 1>t/Dx is obtained.

In order to stabilize the in-plane magnetization Mg of the recording layer 14, it is preferable that the long axis length Dy and the short axis length Dx of the recording layer 14 fulfill 4>Dy/Dx>1.5. Making Dy/Dx greater than 4 is unnecessary because an increase in magnetic anisotropy does not cause an increase in thermal stability index. When the long axis length Dy and the short axis length Dx are within the above-mentioned range, the recording layer becomes more efficient, and is suited for higher integration and size reduction. On the other hand, when Dy/Dx is equal to or smaller than 1.5, the magnetic anisotropy would be too small to achieve a sufficient thermal stability index.

An increase in short axis length Dx means an increase in thickness t, and an increase in thickness t means and an increase in etching time. Thus, as long as the current etching technology is utilized, from the perspective of the memory manufacturing time as well as the relationship with the thickness of a mask formed on the magnetic tunnel junction, it is preferable that the short axis length Dx be smaller than 30 nm.

A high performance index can still be achieved in principle even if Dx is greater than 30 nm. However, if Dx is approximately 70 nm as in the conventional in-plane magnetization type, the thickness "t" needs to be at least 30 nm in order to achieve a high performance index. In this case, it is possible to achieve a high performance index, and the thermal stability index is several hundreds to several thousands as shown in FIG. 7, which is sufficiently large. On the other hand, the write current is several hundreds to several thousands μA, which is excessively large, and it is not possible to provide such a large current to the element. In other words, if Dx is large enough, the required value of the thermal stability index, which is 60, can be obtained even if the performance index is not large, and the writing current in this case can be set to an appropriate range.

Actually, as shown in FIGS. 7A to 7C, the design values used for the magnetoresistance effect element of the conventional in-plane magnetization type are located much further to the left of the peak, and even with the conventional configuration, it was possible to keep the write current under a proper value while fulfilling the required value of the thermal stability index. However, in order to achieve a more highly integrated magnetic memory that is included in the most recent semiconductor manufacturing process, Dx needs to be smaller. Thus, it was difficult to achieve both a sufficiently large thermal stability index and a sufficiently small writing current with the conventional design concept. This is the reason why the mainstream of the study has shifted from the in-plane magnetization type to the perpendicular magnetization type.

On the other hand, in the present invention, the inventor has discovered that a desired performance can be achieved even in the in-plane magnetization type by applying a different design concept, and has found an appropriate design range, and in this sense, the magnetoresistance effect element of the present invention differs from a magnetoresistance effect element of the conventional in-plane magnetization type.

As described above, the magnetoresistance effect element 10 of this embodiment has the following features:

i) The magnetoresistance effect element 10 is of the in-plane magnetization type in which the magnetization directions of the reference layer 12 and the recording layer 14 are parallel to the film plane;

ii) The ratio t/Dx of the thickness "t" to the short axis length Dx of the recording layer 14 is greater than 0.3, and therefore, the performance index can be at least 1.5 $\mu A^{-1}$. This makes it possible to ensure at least 10 years of data storage period while keeping the write current $I_w$ low.

iii) Because the ratio t/Dx of the thickness "t" to the short axis length Dx of the recording layer 14 is smaller than 1, it is possible to suppress the energy loss in magnetization reversal.

iv) By fulfilling the condition of the ratio Dy/Dx (the long axis length Dy to the short axis length Dx) of the recording layer 14 being greater than 1.5, the magnetization Mg can be stably maintained.

On the other hand, because the ratio Dy/Dx (the long axis length Dy to the short axis length Dx) of the recording layer 14 is smaller than 4, the size of the recording layer 14 is not made greater than necessary, which is suited for higher integration and further reduction in size.

v) Because the short axis length Dx of the recording layer 14 is equal to or smaller than 30 nm, an increase in etching time in the manufacturing process can be avoided, and the recording layer 14 can be manufactured under the stable conditions. Also, it is possible to keep the write current at a level that can realistically be supplied.

Figure 9A:
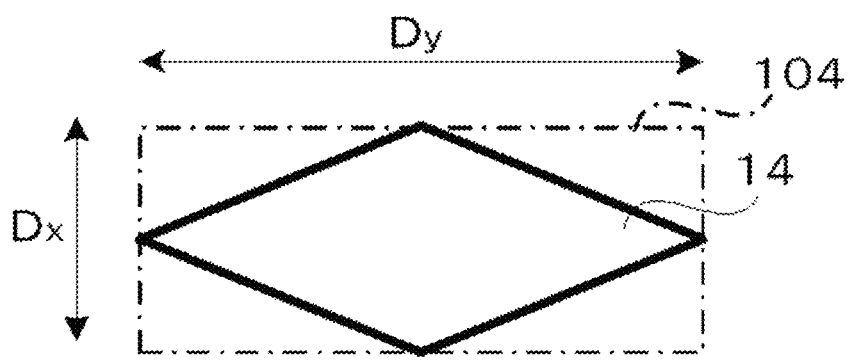
FIGS. 9A and 9B are diagrams for explaining a method to obtain the long axis length Dy and the short axis length Dx when the planar shape of the recording layer is not a rectangle.
Figure 9B:
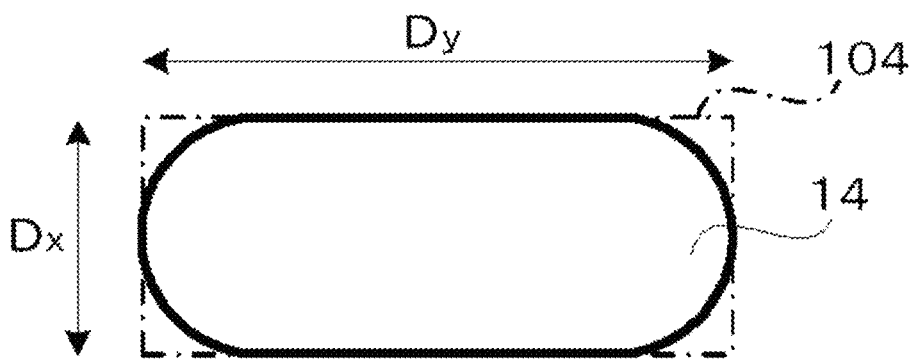

The planar shape of the recording layer 14 is not limited to an oval, and as shown in FIGS. 8A to 8D, any shape can be selected. In this case, as shown in FIGS. 9A and 9B, a rectangle 104 that is externally in contact with the planer shape of the recording layer 14 with a minimum contact area needs to be drawn, and the direction in which the longer side of the rectangle 104 extends is the easy-axis of magnetization, and the longer side of the rectangle is the long axis length Dy, and the shorter side of the rectangle is the short axis length Dx. In the example of the figure, all shapes are symmetric with respect to the X axis and Y axis, but even with asymmetric shape, the effect of the present invention can be achieved.

Formula (1) and Formula (2) for deriving the thermal stability index Δ and the write current $I_w$ vary depending on the planar shape of the recording layer 14, but in any case, by fulfilling the conditional equation of t/Dx>0.3, it is possible to achieve the performance index that is at least 1.5 $\mu A^{-1}$.

The configuration of the magnetoresistance effect element is not limited to the configuration shown in FIGS. 1 and 2.

Figure 10:
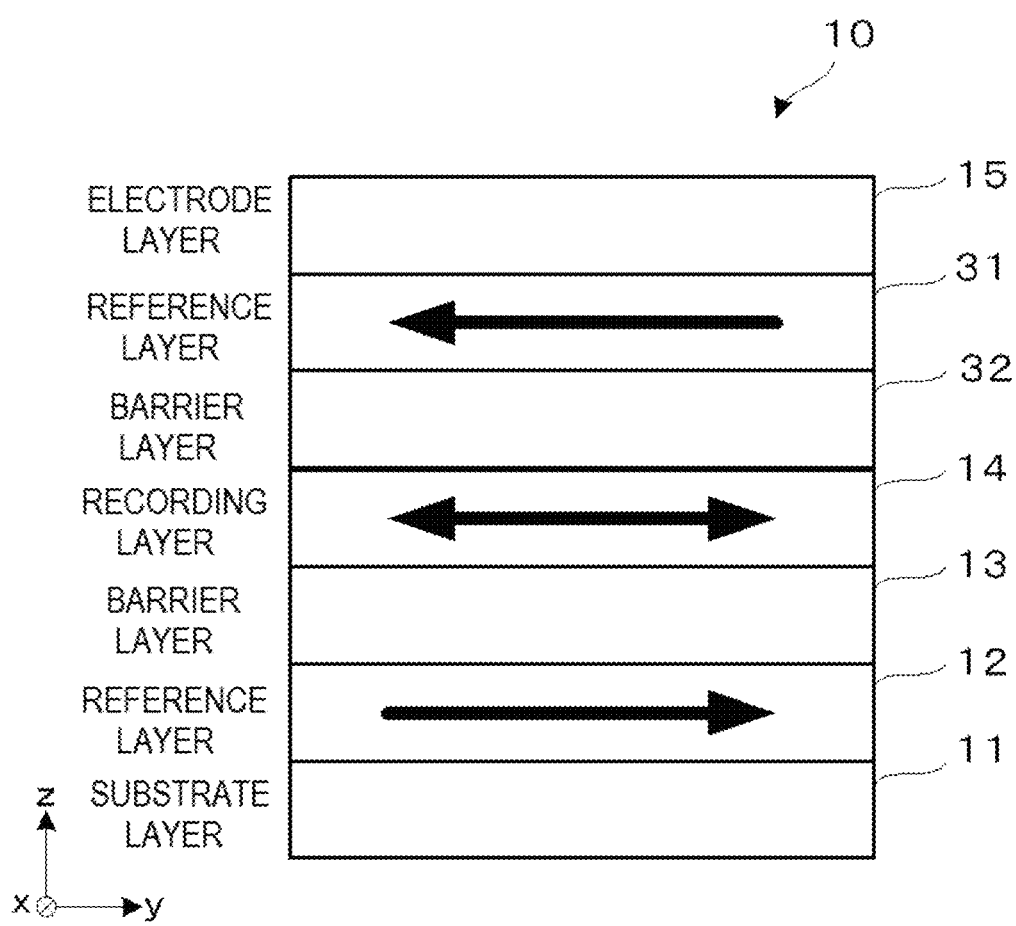
FIG. 10 is a diagram showing another example of the structure of a magnetoresistance effect element of an embodiment.

For example, as shown in FIG. 10, it is also possible to dispose a second reference layer 31 and a second barrier layer 32.

Figure 11:
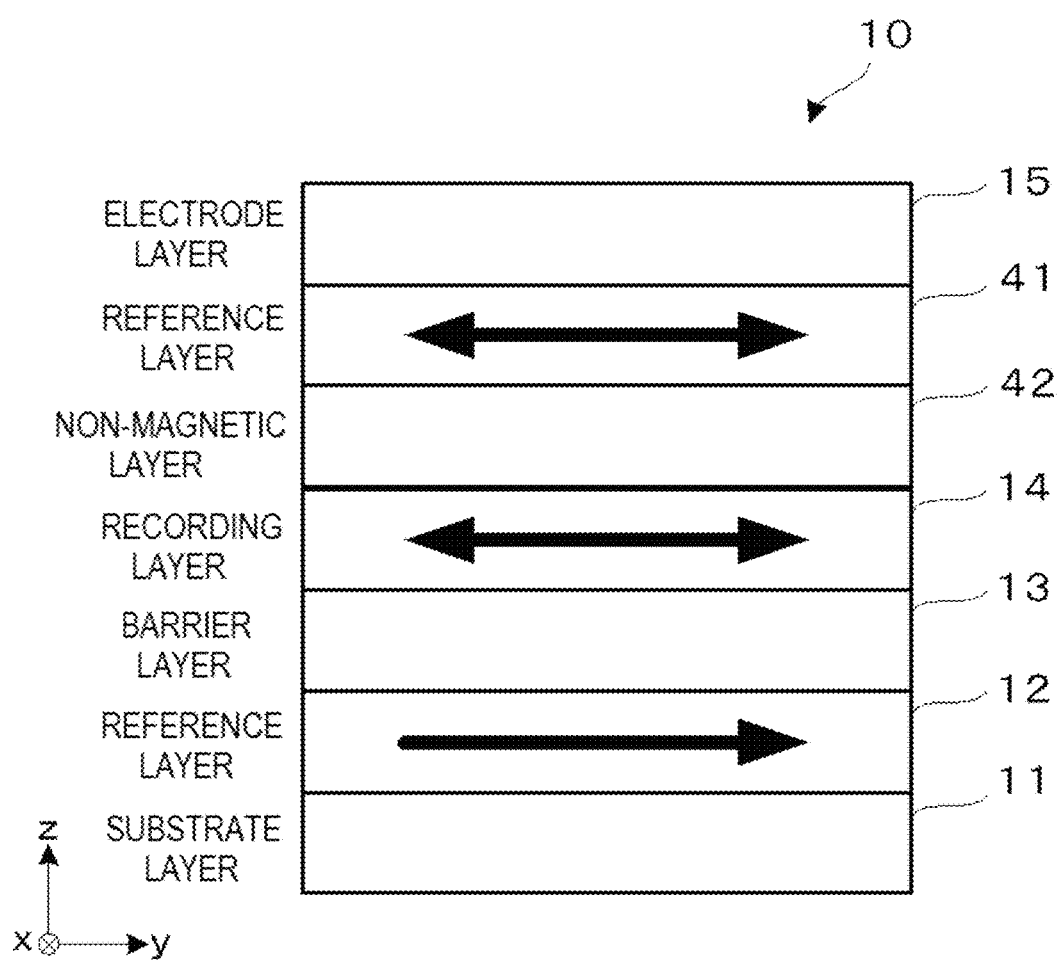
FIG. 11 is a diagram showing another example of the structure of a magnetoresistance effect element of an embodiment.

As shown in FIG. 11, it is also possible to dispose a non-magnetic layer 42 and a second recording layer 41. In this case, the thickness and the material of the non-magnetic layer 42 are selected so as to provide a magnetic bonding between the first recording layer 14 and the second recording layer 41.

Figure 12:
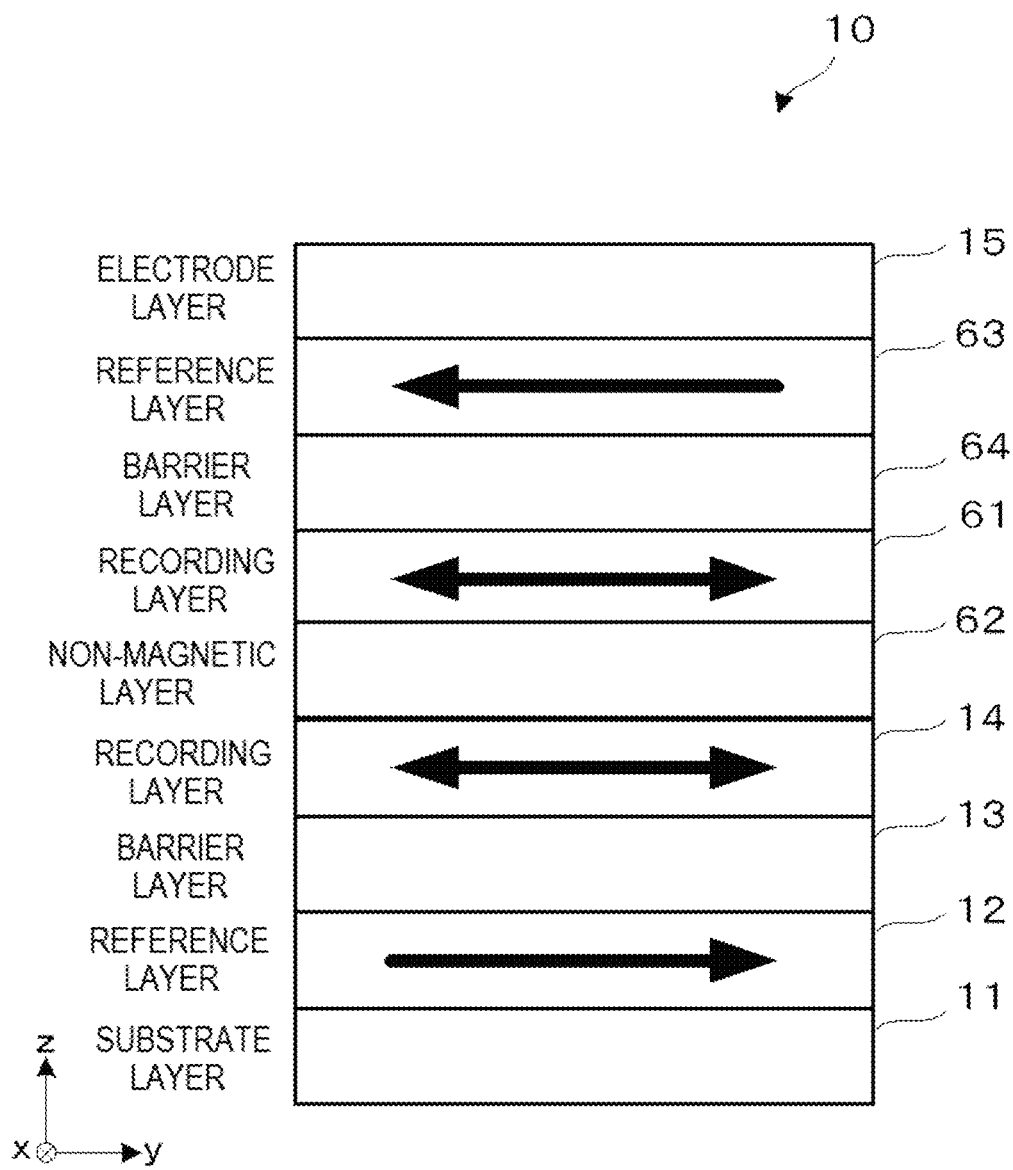
FIG. 12 is a diagram showing another example of the structure of a magnetoresistance effect element of an embodiment.

Furthermore, as shown in FIG. 12, it is also possible to dispose a non-magnetic layer 62, a recording layer 61, a barrier layer 64, and a reference layer 63.

When there are a plurality of recording layers, the total film thickness of all recording layers needs to fulfill the conditions described above.

The present invention is not limited by the description of embodiment above or diagrams, and it is possible to modify the embodiment and diagrams where appropriate.

What is claimed is:

1. A magnetoresistance effect element, comprising:
a reference layer made of a ferromagnetic material, the reference layer having an in-plane magnetization direction parallel to a surface of the reference layer;
a recording layer made of a ferromagnetic material, the recording layer having the in-plane magnetization direction, the recording layer having a shape that has short axis and long axis perpendicular to the short axis in plan view, a first value obtained by dividing a thickness of the recording layer by a length of the short axis of the recording layer being greater than 0.3 and being smaller than 1; and
a barrier layer disposed between the reference layer and the recording layer, wherein
the magnetoresistance effect element has a performance index equal to or greater than 1.5 $\mu A^{-1}$, the performance index being obtained by dividing a thermal stability index of the magnetoresistance effect element by a write current of the magnetoresistance effect element,
the magnetoresistance effect element has a thermal stability index equal to or greater than 60,
the magnetoresistance effect element has a write current equal to or less than 40 μA, and
the length of the short axis of the recording layer is equal to or less than 30 nm.

2. The magnetoresistance effect element according to claim 1, wherein the length of the short axis of the recording layer is equal to or less than 14 nm.

3. The magnetoresistance effect element according to claim 1, wherein a second value obtained by dividing a length of the long axis of the recording layer by the length of the short axis of the recording layer is greater than 1.5.

4. The magnetoresistance effect element according to claim 1, wherein a second value obtained by dividing a length of the long axis of the recording layer by the length of the short axis of the recording layer is less than 4.

5. The magnetoresistance effect element according to claim 2, wherein a second value obtained by dividing a length of the long axis of the recording layer by the length of the short axis of the recording layer is greater than 1.5 and is less than 4.

6. A magnetic memory including, as a memory cell, the magnetoresistance effect element according to claim 1.

7. A magnetoresistance effect element, comprising:
a reference layer made of a ferromagnetic material, the reference layer having an in-plane magnetization direction parallel to a surface of the reference layer;
a recording layer made of a ferromagnetic material, the recording layer having the in-plane magnetization direction, the recording layer having a shape that has short axis and long axis perpendicular to the short axis in plan view, a first value obtained by dividing a thickness of the recording layer by a length of the short axis of the recording layer being greater than 0.3 and being smaller than 1; and
a barrier layer disposed between the reference layer and the recording layer, wherein
the length of the short axis of the recording layer is equal to or less than 30 nm.

8. The magnetoresistance effect element according to claim 7, wherein the magnetoresistance effect element has a thermal stability index equal to or greater than 60.

9. The magnetoresistance effect element according to claim 7, wherein the magnetoresistance effect element has a performance index equal to or greater than 1.5 $\mu A^{-1}$, the performance index being obtained by dividing a thermal stability index of the magnetoresistance effect element by a write current of the magnetoresistance effect element.

10. The magnetoresistance effect element according to claim 7, wherein the magnetoresistance effect element has a write current equal to or less than 40 μA.

11. The magnetoresistance effect element according to claim 7, wherein a second value obtained by dividing a length of the long axis of the recording layer by the length of the short axis of the recording layer is greater than 1.5.

12. The magnetoresistance effect element according to claim 7, wherein a second value obtained by dividing a length of the long axis of the recording layer by the length of the short axis of the recording layer is less than 4.

13. A magnetic memory including, as a memory cell, the magnetoresistance effect element according to claim 7.

14. A magnetoresistance effect element, comprising:
a reference layer made of a ferromagnetic material, the reference layer having an in-plane magnetization direction parallel to a surface of the reference layer;

a recording layer made of a ferromagnetic material, the recording layer having the in-plane magnetization direction, the recording layer having a shape that has short axis and long axis perpendicular to the short axis in plan view, a first value obtained by dividing a thickness of the recording layer by a length of the short axis of the recording layer being greater than 0.3 and being smaller than 1; and a barrier layer disposed between the reference layer and the recording layer, wherein the length of the short axis of the recording layer is equal to or less than 14 nm.

15. A magnetic memory including, as a memory cell, the magnetoresistance effect element according to claim 14.

* * * * *